US009281485B2

(12) United States Patent
Fukushima (10) Patent No.: US 9,281,485 B2
(45) Date of Patent: Mar. 8, 2016

(54) LIGHT-RECEIVING DEVICE (71) Applicant: Sharp Kabushiki Kaisha, Osaka-shi, Osaka (JP)

(72) Inventor: Yasumori Fukushima, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/407,574

(22) PCT Filed: Jun. 10, 2013

(86) PCT No.: PCT/JP2013/065918
§ 371 (c)(1),
(2) Date: Dec. 12, 2014

(87) PCT Pub. No.: WO2013/187344
PCT Pub. Date: Dec. 19, 2013

(65) Prior Publication Data
US 2015/0155509 A1    Jun. 4, 2015

(30) Foreign Application Priority Data

Jun. 14, 2012    (JP) .................. 2012-134578

(51) Int. Cl.
| H01L 29/08 | (2006.01) |
| H01L 35/24 | (2006.01) |
| H01L 51/00 | (2006.01) |
| H01L 31/101 | (2006.01) |
| H01L 51/44 | (2006.01) |
| H01L 27/146 | (2006.01) |
| H01L 27/28 | (2006.01) |
| H01L 27/30 | (2006.01) |

(52) U.S. Cl.
CPC .......... *H01L 51/44* (2013.01); *H01L 27/14621* (2013.01); *H01L 27/14681* (2013.01); *H01L 27/283* (2013.01); *H01L 27/307* (2013.01); *H01L 27/14632* (2013.01)

(58) Field of Classification Search
None
See application file for complete search history.

(56) References Cited

U.S. PATENT DOCUMENTS

| 2002/0117682 A1* | 8/2002 | Vande Voorde ... H01L 27/14681 257/149 |
| 2009/0224235 A1 | 9/2009 | Kitamura et al. |
| 2011/0156996 A1* | 6/2011 | Izumi ................ H01L 27/14609 345/92 |

FOREIGN PATENT DOCUMENTS

| JP | 2003-158254 A | 5/2003 |
| JP | 2007-123707 A | 5/2007 |
| JP | 2009-212389 A | 9/2009 |
| JP | 2009-260134 A | 11/2009 |
| JP | 2009260134 A * | 11/2009 |

OTHER PUBLICATIONS

Official Communication issued in International Patent Application No. PCT/JP2013/065918, mailed on Aug. 20, 2013.

* cited by examiner

Primary Examiner — Hoang-Quan Ho
(74) Attorney, Agent, or Firm — Keating & Bennett, LLP (57) ABSTRACT

For simplification of a structure and a manufacturing process of an element, and reduction of manufacturing cost, the present disclosure provides a light-receiving device including: a photoelectric conversion element; and an active element, wherein the active element includes at least one of a reset element configured to reset the photoelectric conversion element, an amplifier element configured to amplify a detection signal based on the photoelectric conversion element, or a selection element configured to selectively output the detection signal based on the photoelectric conversion element, and the photoelectric conversion element and at least part of the active element are formed by using an identical organic semiconductor material or an identical high molecular functional material.

5 Claims, 5 Drawing Sheets

LIGHT-RECEIVING DEVICE

TECHNICAL FIELD

The present disclosure relates to light-receiving devices having photoelectric conversion elements, such as image sensors, etc., particularly to light-receiving devices using an organic semiconductor material.

BACKGROUND ART

Technologies using an organic material as a material of a photoconductive film for forming photoelectric conversion elements have been known. The organic material has a wide variety of types and characteristics, and can flexibly be processed into various shapes (see, e.g., Patent Document 1, and Non-Patent Document 1).

A light-receiving device using the photoelectric conversion elements described above, such as an image sensor, etc., is provided with transistors for selectively extracting an electrical signal obtained by photoelectric conversion, such as switching elements, etc. There are known technologies for forming the photoelectric conversion elements using the organic material on a monocrystalline silicon substrate on which the transistors are formed by a so-called CMOS process, or on a glass substrate on which thin transparent organic film transistors are formed (see, e.g., Patent Documents 2 and 3).

CITATION LIST

Patent Documents

[Patent Document 1] Japanese Unexamined Patent Publication No. 2003-158254
[Patent Document 2] Japanese Unexamined Patent Publication No. 2007-123707
[Patent Document 3] Japanese Unexamined Patent Publication No. 2009-212389

Non-Patent Document

[Non-Patent Document 1] Jun Sakai, et. al., "Stacked Organic Thin-Film Solar Cell Manufactured with Coating Process," Panasonic Electronic Works Technical Report, September 2009, Volume 57, No. 1, pp. 46-50

SUMMARY OF THE INVENTION

Technical Problem

When the transistors formed on the monocrystalline silicon substrate or the thin transparent organic film transistors formed on the glass substrate and the photoelectric conversion elements using the organic material are layered as described above, a structure and a manufacturing process of the elements tend to be complicated, and a manufacturing cost increases due to use of many different types of materials.

In view of the foregoing, the present disclosure has been achieved to simplify the structure and the manufacturing process of the elements, thereby facilitating reduction of the manufacturing cost.

Solution to the Problem

A first aspect of the present disclosure is related to a light-receiving device, including: a photoelectric conversion element; and an active element, wherein the active element includes at least one of a reset element configured to reset the photoelectric conversion element, an amplifier element configured to amplify a detection signal based on the photoelectric conversion element, or a selection element configured to selectively output the detection signal based on the photoelectric conversion element, and the photoelectric conversion element and at least part of the active element are formed by using an identical organic semiconductor material or an identical high molecular functional material.

According to the first aspect, a layered structure is avoided, a manufacturing process can easily be simplified, the number of manufacturing steps can easily be reduced, and commonality of materials can easily be promoted. Therefore, the manufacturing cost can easily be reduced.

A second aspect of the present disclosure is related to the light-receiving device of the first aspect of the present disclosure, wherein the photoelectric conversion element and the active element are formed by using at least one of an identical electrode material or an identical insulating material.

According to the second aspect, the simplification of the manufacturing process, etc. can easily be achieved, and the manufacturing cost can be reduced more easily.

A third aspect of the present disclosure is related to the light-receiving device of any one of the first or second aspect of the present disclosure, wherein the photoelectric conversion element is a phototransistor constituted of a pnp-type or npn-type layered organic semiconductor bipolar transistor.

A fourth aspect of the present disclosure is related to the light-receiving device of any one of the first to third aspects of the present disclosure, wherein a base layer of the phototransistor has a thickness of 10 nm or larger and 40 nm or smaller.

According to the third and fourth aspects, sensitivity to incident light can relatively easily be enhanced.

A fifth aspect of the present disclosure is related to the light-receiving device of any one of the first to fourth aspects of the present disclosure, wherein the photoelectric conversion element and the active element are formed on a glass substrate.

According to the fifth aspect, the elements can easily be formed.

A sixth aspect of the present disclosure is related to the light-receiving device of any one of the first to fourth aspects of the present disclosure, wherein the photoelectric conversion element and the active element are formed on a film substrate.

According to the sixth aspect, a lightweight, flexible, and unbreakable image sensor can easily be obtained.

Advantages of the Invention

According to the present disclosure, the structure and the manufacturing process of the elements can easily be simplified, and the manufacturing cost can easily be reduced.

DESCRIPTION OF EMBODIMENTS

As an example embodiment of the present disclosure, an example image sensor including phototransistors as photoelectric conversion elements formed by using an organic semiconductor material or a high molecular functional material and arranged in a matrix array will be described in detail with reference to the drawings. In the following embodiments, components having the similar function are referenced by the same reference numerals to omit explanation thereof.

First Embodiment

Circuit Structure

Figure 1:
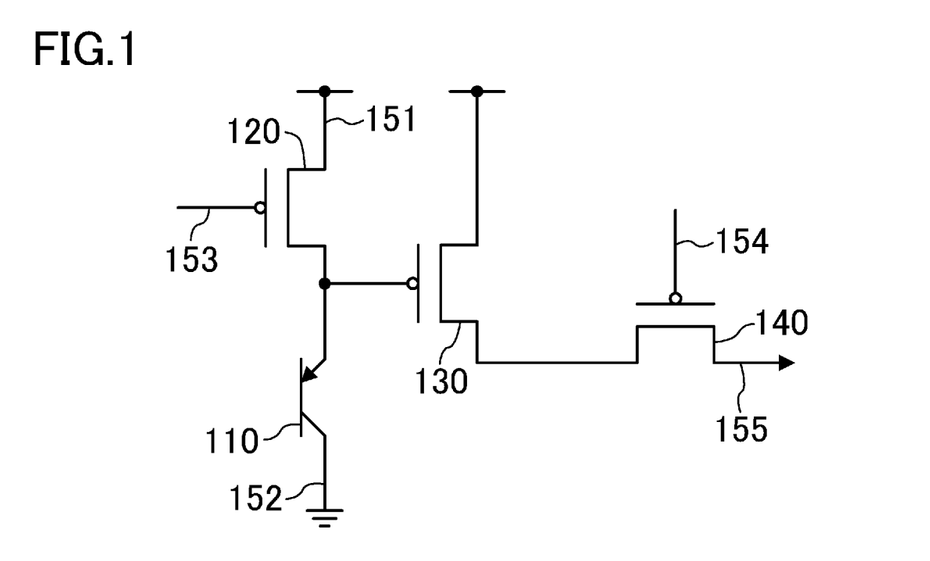
FIG. 1 is a circuit diagram showing a structure of a major part of an image sensor of a first embodiment.

Each of pixels of an image sensor includes, as shown in FIG. 1, for example, a pnp-type phototransistor 110, as well as a reset transistor 120 (a reset element), an amplifier transistor 130 (an amplifier element), and a row selection transistor 140 (a row selection element) which are p-type thin film transistors (TFTs) as active elements.

The reset transistor 120 and the phototransistor 110 are connected in series between a power supply line 151 and a ground line 152 so that a power supply voltage is applied to an emitter of the phototransistor 110 when a reset line 153 is at a low (L) level. The amplifier transistor 130 is configured to amplify a potential of the emitter of the phototransistor 110. The row selection transistor 140 is configured to output a signal amplified by the amplifier transistor 130 to a column output line 155 when a selection line 154 is at a L level.

(Substantive Structure)

Figure 2:
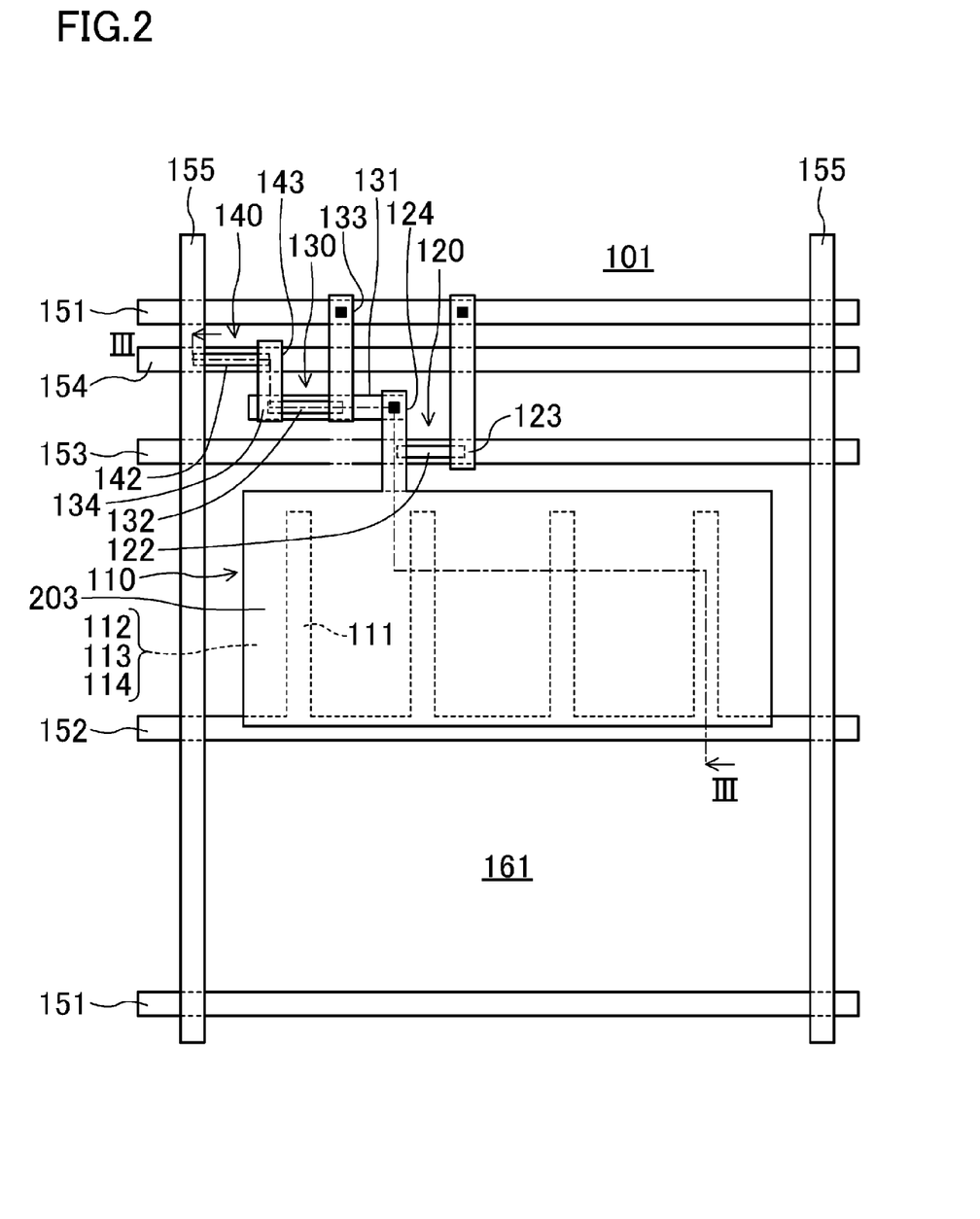
FIG. 2 is a plan view showing a wiring pattern in the major part of the image sensor of the first embodiment.
Figure 3:
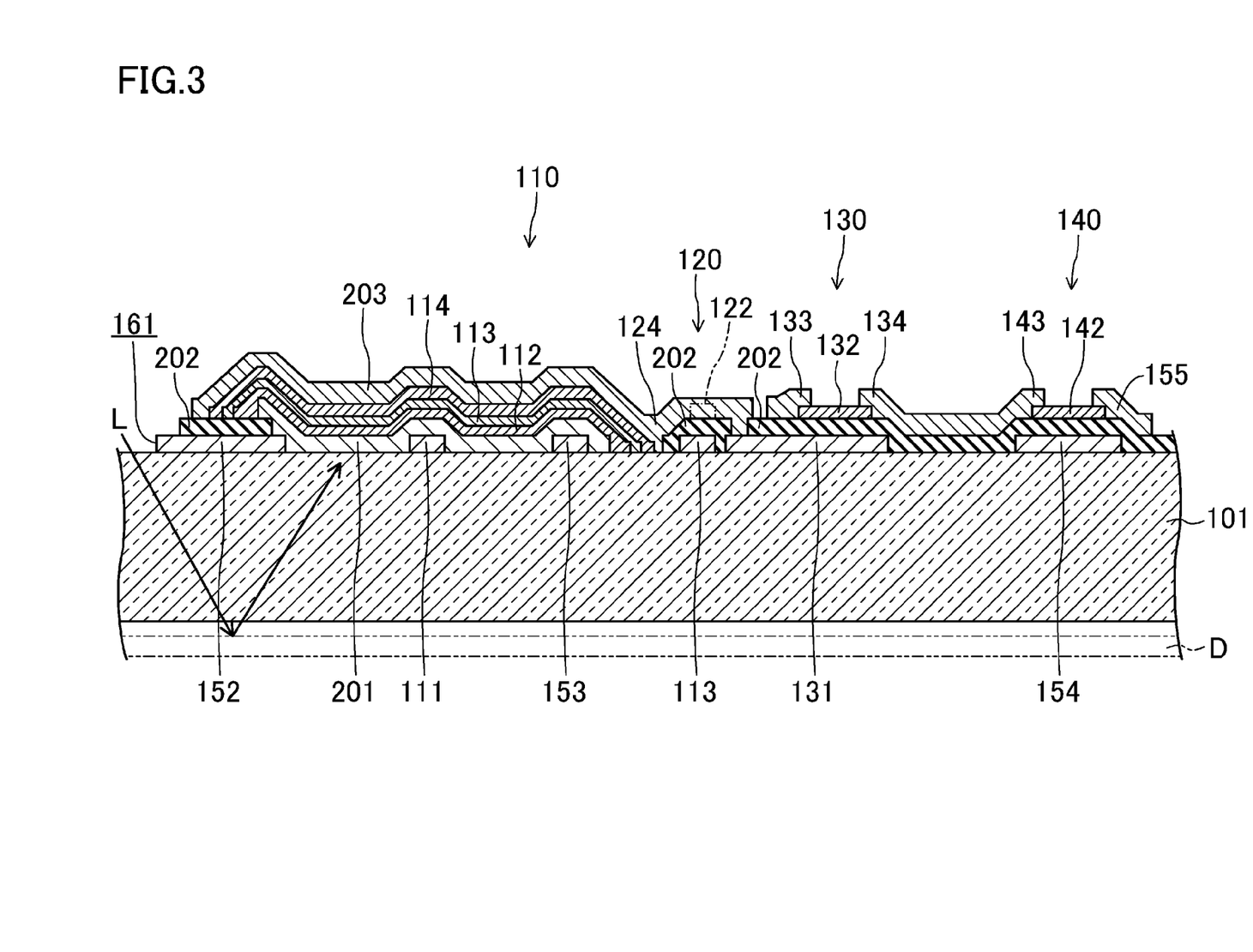
FIG. 3 is a cross-sectional view taken along the line III-III in FIG. 2.
Figure 4:
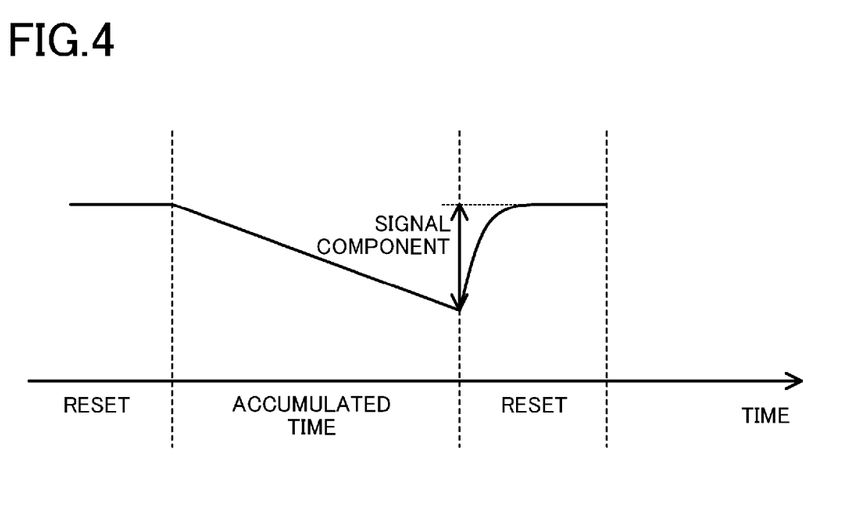
FIG. 4 is a timing chart of an image capturing operation.

Each of the elements described above is formed on a glass substrate 101 as shown in FIGS. 2 and 3, for example. Specifically, the power supply lines 151, the ground lines 152, and the reset lines 153 parallel to each other, and the column output lines 155 extending in a direction perpendicular to these lines are formed on the glass substrate 101. Every region surrounded by the adjacent power supply lines 151 and the adjacent column output lines 155 constitutes a single pixel, and the phototransistor 110 is configured to detect light L incident from an open region 161 and reflected on a source document D.

The phototransistor 110 includes a transparent conductive film 201, a p-type organic semiconductor film 112, an n-type organic semiconductor film 113, a p-type organic semiconductor film 114, and a metal interconnection 203 which are sequentially stacked on the glass substrate 101 to cover a metal interconnection 111 connected to the ground line 152. The metal interconnection 111 serves as a current extracting electrode of a collector of the phototransistor 110, and is comb-shaped, for example, so that light through the glass substrate 101 can enter the phototransistor 110. The transparent conductive film 201 and the metal interconnection 203 serve as a collector electrode and an emitter electrode of the phototransistor 110, respectively. The metal interconnection 203 also serves as a light blocking film preventing exposure of the organic semiconductor films 112-114 to light incident from above in FIG. 3. An insulating film 202 is formed on the ground line 152 present at an edge of the phototransistor 110 to insulate the organic semiconductor films 112-114 and the metal interconnection 203 from the ground line 152.

The reset transistor 120 is formed by sequentially stacking the insulating film 202 and a p-type organic semiconductor film 122 on part of the reset line 153 which is formed on the glass substrate 101 and also serves as a gate electrode. An end of the p-type organic semiconductor film 122 is connected to the power supply line 151 through a source electrode 123, and the other end is connected to a drain electrode 124 formed to be continuous with the metal interconnection 203 of the phototransistor 110.

The amplifier transistor 130 is formed by sequentially stacking the insulating film 202 and a p-type organic semiconductor film 132 on part of a gate electrode 131 formed on the glass substrate 101, and the row selection transistor 140 is formed by sequentially stacking the insulating film 202 and a p-type organic semiconductor film 142 on part of the selection line 154 which is formed on the glass substrate 101 and also serves as a gate electrode. The gate electrode 131 of the amplifier transistor 130 is connected to the metal interconnection 203 of the phototransistor 110 and the drain electrode 124 of the reset transistor 120. An end of the p-type organic semiconductor film 132 is connected to the power supply line 151 through a source electrode 133, and the other end is connected to a drain electrode 134. The drain electrode 134 is connected to a source electrode 143 connected to an end of the p-type organic semiconductor film 142 of the row selection transistor 140. The other end of the p-type organic semiconductor film 142 of the row selection transistor 140 is connected to the column output line 155 also serving as a drain electrode.

The p-type organic semiconductor films 112, 122, 132, 142, etc. constituting the phototransistor 110, the reset transistor 120, the amplifier transistor 130, and the row selection transistor 140 are formed in the same step using the same organic semiconductor material as described in detail below.

(Manufacturing Step)

The image sensor described above, in the shape of a film, can easily be formed in a manufacturing process which is based on a so-called coating step, and does not require high vacuum environment by using an organic semiconductor material, a high molecular functional material, etc. at a lower temperature and lower cost as compared with a manufacturing process using an inorganic material, such as silicon, etc. More specifically, the image sensor can be manufactured as described below, for example.

(1) A metal electrode pattern is formed on the glass substrate 101 to provide the power supply line 151, the ground line 152, the metal interconnection 111 of the phototransistor 110, the reset line 153 also serving as the gate electrode of the reset transistor 120, the gate electrode 131 of the amplifier transistor 130, and the selection line 154 also serving as the gate electrode of the row selection transistor 140.

More specifically, for example, the metal electrode pattern can be formed by gravure printing, offset printing, reverse offset printing, etc. using a conductive polymer solution or dispersion, or a dispersion of fine metal particles. Examples of materials for forming the metal electrode may include silver, gold, copper, etc. having a particle diameter in a nanometer order and being dispersed in a solution, for example. The metal electrode may be about 100-500 nm in thickness. The obtained pattern is preferably baked for several minutes to several ten minutes at about 100-150° C., for example, to evaporate a solvent, and to reduce resistance of a metal interconnection.

(2) A pattern of the insulating film 202 is formed on the metal interconnection. The insulating film 202 will be an insulating film insulating the organic semiconductor films 112-114 and the metal interconnection 203 of the phototransistor 110, or gate insulating films of the reset transistor 120, the amplifier transistor 130, and the row selection transistor 140.

The pattern of the insulating film 202 can also be formed by a printing method in the same manner as the formation of the metal electrode pattern. Examples of materials for forming the insulating film may include polyimide, polystyrene, poly (4-vinylphenol) (PVP), poly(vinyl alcohol) (PVA), poly(methyl methacrylate) (PMMA), divinyl-tetramethyl-disiloxane-bis(benzocy-clobutene) (BCB), etc., and the insulating film may be about 100-1000 nm in thickness. The obtained pattern is preferably baked for several minutes to several ten minutes at about 100-150° C., for example, to evaporate a solvent to form the insulating film.

(3) A pattern of the transparent conductive film 201 of a coating type, for example, is printed on a region for forming the phototransistor 110.

Examples of materials for forming the transparent conductive film 201 may include an indium tin oxide (ITO) coating, metal nanowire, carbon nanotube, etc. The transparent conductive film 201 may be about 100-300 nm in thickness. The obtained pattern is preferably baked at about 100-150° C. for several minutes to several ten minutes, for example, to evaporate a solute, and to reduce resistance of the transparent conductive film.

(4) A pattern of the p-type organic semiconductor film 112 serving as a collector layer of the phototransistor, and the p-type organic semiconductor films 122, 132, 142 serving as active layers of the reset transistor 120, the amplifier transistor 130, and the row selection transistor 140 is formed by printing.

Examples of materials for forming the p-type organic semiconductor layer may include low molecular p-type organic semiconductors including soluble semiconductors such as TIPS pentacene (6,13-Bis(triisopropylsilylethynyl)pentacene), TIPS anthracene (9,10-Bis[(triisopropylsilyl)ethynyl] anthracene), TES pentacene (6,13-Bis((triethylsilyl)ethynyl) pentacene), etc., precursors of soluble organic semiconductors such as NSFAAP (13,6-N-Sulfinylacetamidopentacene), pentacene-N-sulfinyl-tert-butylcarbamate, etc.

Examples of materials for forming the p-type organic semiconductor layer may also include high molecular p-type semiconductors such as poly(3-hexylthiophene-2,5-diyl) (P3HT), poly(3-octylthiophene-2,5-diyl) (P3OT), poly(2-methoxy-5-(2-ethylhexyloxy)-1,4-phenylenevinylene (MEH-PPV), poly(3-dodecylthiophene-2,5-diyl) (P3DDT), poly((9,9-diocthlfluorennyl-2,7-diyl)-co-bithiophene) (F8T2), poly((9,9-di-n-octylfluorenyl-2,7-diyl)-alt-(benzo (2,1,3)thiadiazol-4,8-diyl)) (F8BT), poly(bis(4-phenyl)(2,4, 6-trimethylphenyl)amine) (PTAA), etc. The low molecular and high molecular p-type organic semiconductors may be blended.

The obtained pattern is preferably baked for several minutes to several ten minutes at about 100-150° C., for example, to evaporate the solvent to form the p-type organic semiconductor layer.

(5) A pattern of the n-type organic semiconductor film 113 serving as a base layer of the phototransistor 110 is formed by printing. When n-type transistors are used as the reset transistor 120, etc., an n-type organic semiconductor film serving as an active layer of the transistor may simultaneously be formed.

Examples of materials for forming the n-type organic semiconductor layer may include low molecular n-type organic semiconductors such as (6,6)-phenyl C61 butyric acid methyl ester ([60]PCBM), (6,6)-phenyl C71 butyric acid methyl ester ([70]PCBM), (6,6)-phenyl C61 butyric acid octyl ester (PCBO), (6,6)-phenyl-C61 butyric acid butyl ester (PCBB), (6,6)-thienyl C61 butyric acid methyl ester ([60]ThPCBM), (6,6)diphenyl C62 bis(butyric acid methyl ester), fullerene-C60, fullerene-C70, etc.

Examples of the materials for forming the n-type organic semiconductor layer may also include high molecular p-type organic semiconductors such as poly(benzimidazobenzophenanthroline) (BBL), etc. The low molecular and high molecular n-type organic semiconductors may be blended.

The obtained pattern is preferably baked for several minutes to several ten minutes at about 100-150° C., for example, to evaporate a solvent to form the p-type organic semiconductor layer.

Taking into account that a region contributable to a photo-electromotive force is at a distance of about ±20 nm from a pn junction, the base layer preferably has a thickness of about 10 nm or larger and 40 nm or smaller, for example.

(6) The p-type organic semiconductor film 114 serving as an emitter layer of the phototransistor 110 is formed in the same manner using the same material as the step (4). All or some of the p-type organic semiconductor film 122, etc. of the reset transistor 120, etc. may be formed in this step in place of the step (4).

(7) The column output line 155 also serving as the metal interconnection 203 of the phototransistor 110, the source electrode 123 and the drain electrode 124 of the reset transistor 120, the source electrode 133 and the drain electrode 134 of the amplifier transistor 130, the source electrode 143 of the row selection transistor 140, and the drain electrode of the row selection transistor 140 is formed in the same manner using the same material as the step (1).

(8) An insulating layer such as a protective film may be formed on the phototransistor 110 (i.e., the metal interconnection 203), the reset transistor 120, etc. Prior to the formation of the layers such as the metal interconnection 111, the insulating film 202, the organic semiconductor films 112-114, etc., ultraviolet irradiation, plasma treatment, surface cleaning such as wet cleaning, etc. may be performed as required.

(Operation of Image Sensor)

In the image sensor configured as described above, when the reset transistor 120 is turned on to reset the phototransistor 110, and then the reset transistor 120 is turned off, a potential of the emitter of the phototransistor 110 decreases depending on the intensity of incident light. The decrease, as a signal component, is amplified by the amplifier transistor 130, and is output through the column output line 155 when the row selection transistor 140 is turned on. Thus, photoelectric conversion is performed in each pixel, thereby performing image capturing.

The phototransistor 110, the reset transistor 120, etc. are formed in the same step using the same organic semiconductor material, the same metal interconnection, and the same insulating film, etc. as described above. Thus, a layered structure can be avoided, the manufacturing process can be simplified, the number of steps can be reduced, and commonality of materials can be promoted. Therefore, the manufacturing cost can easily be reduced.

Second Embodiment

The above-described elements may be formed on a film substrate in place of the glass substrate 101 described above. Preferable examples of materials for forming the film substrate may include highly transparent materials, such as polyethylene terephthalate, polyether sulfone, polypropylene, polycarbonate, polyester, etc. Forming the elements on the film substrate can provide a flexible and unbreakable image sensor which is lighter than the image sensor using the glass substrate 101.

Third Embodiment

Figure 5:
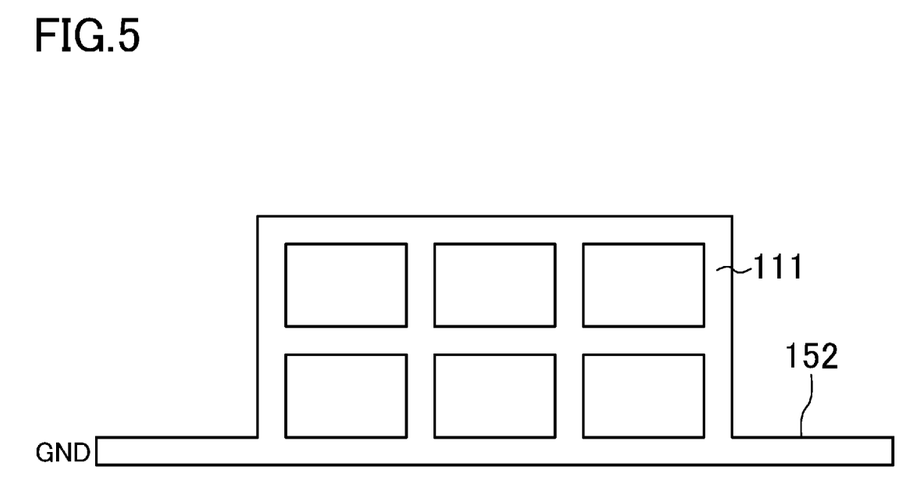
FIG. 5 is a plan view showing an example shape of a metal interconnection of an image sensor of a third embodiment.

The metal interconnection 111 of the first embodiment is in the shape of a comb. However, the shape of the metal interconnection is not limited thereto, and the metal interconnection may be in the shape of a grid as shown in FIG. 5. As another example, the metal interconnection 111 may be formed as a continuous film, and the metal interconnection 203 provided in an upper part of the phototransistor 110 in FIG. 3 may be comb-shaped or grid-shaped so that light incident from above can be received. As yet another example, both of the metal interconnection 111 and the metal interconnection 203 may be comb-shaped or grid-shaped so that light incident from above and below can be received. When a two-layer structure of the comb-shaped or grid-shaped metal interconnection 111 and the transparent conductive film 201 is provided, a current generated by an exciter generated through light absorption can efficiently be collected.

Fourth Embodiment

Figure 6:
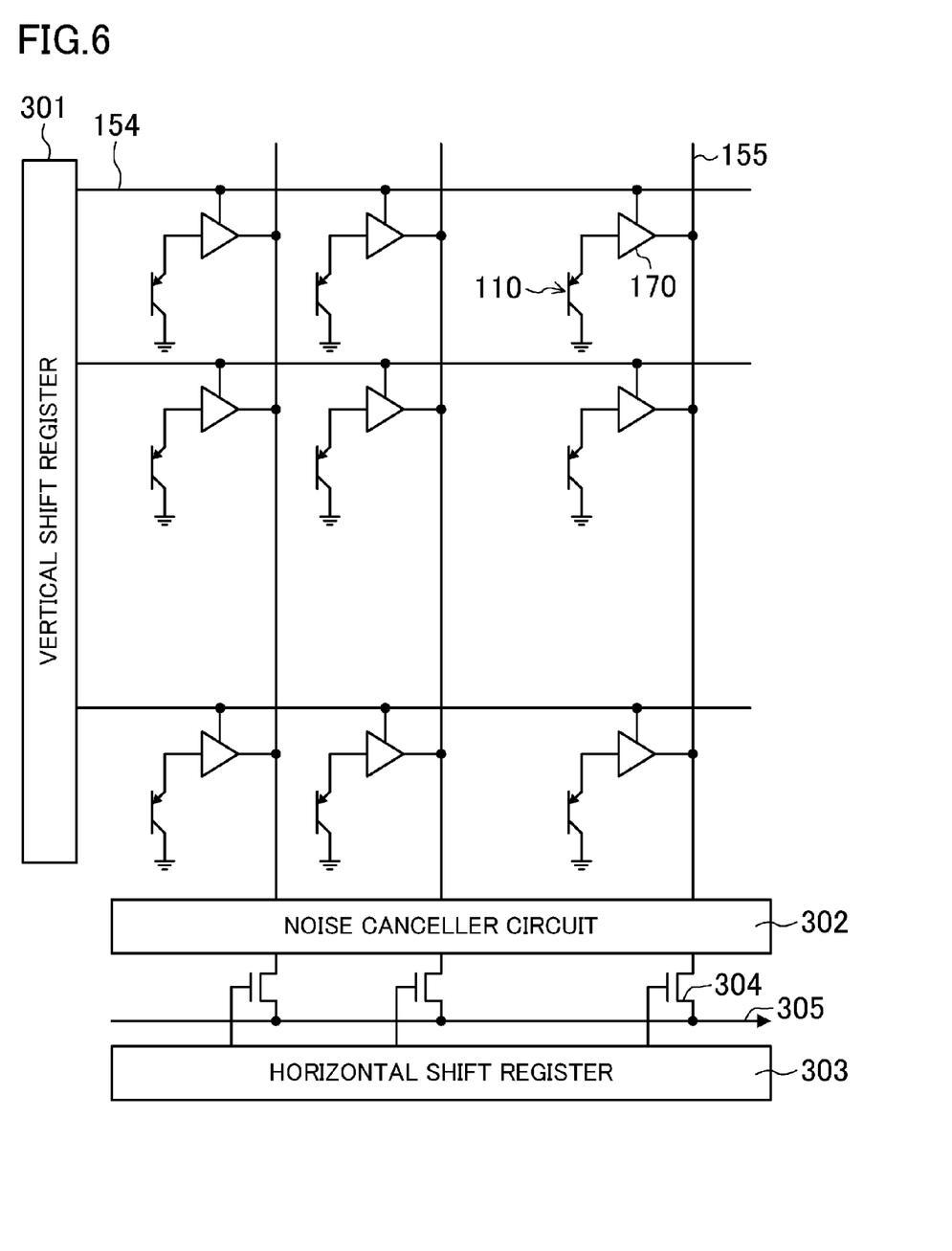
FIG. 6 is a circuit diagram showing a structure of a major part of an image sensor of a fourth embodiment.

In addition to the phototransistor 110, the reset transistor 120, etc. described above, a vertical shift register 301 constituted of a CMOS circuit, etc. and configured to drive a circuit of each pixel, a noise canceller circuit 302, a horizontal shift register 303, a row selection transistor 304, an output line 305, etc. may be formed on the same substrate as shown in FIG. 6. In FIG. 6, for simplicity's sake, the power supply line 151, the ground line 152, and the reset line 153 are not shown, and the reset transistor 120, the amplifier transistor 130, and the row selection transistor 140 are depicted as an amplifier/operation control circuit 170.

In the case where the circuits described above are formed, the p-type and/or n-type transistors constituting the circuits may also be formed in the same step using the same organic semiconductor material for forming the organic semiconductor films 112-114, etc. of the phototransistor 110. This can further facilitate the reduction in manufacturing cost.

Other Embodiments

In the above-described embodiments, the pnp-type phototransistor 110 has been described as an example of the phototransistor 110. However, the phototransistor is not limited thereto, and an npn-type phototransistor may be used. The p-type reset transistor 120, etc. used in the above-described embodiments may be replaced with an n-type transistor, or a combination of p-type and n-type transistors.

When the phototransistor is used as the photoelectric conversion element as described above, current amplification can be achieved by a bipolar transistor structure using generated carriers as a base current. Thus, sensitivity to the incident light can relatively easily be enhanced. However, in the case of a heterojunction photoelectric conversion element including p-type and n-type organic semiconductors joined together, or a bulk heterojunction photoelectric conversion element including a photoelectric conversion layer in which the n-type and p-type organic semiconductors are mixed in a nanometer order so that probability of generated exciters reaching a pn interface can be improved, the manufacturing cost can be reduced by forming the row selection transistor 140, etc. using the same organic semiconductor material.

It will be appreciated that not all the reset transistor 120, the amplifier transistor 130, and the row selection transistor 140 are necessarily provided, and they may be provided as needed. The manufacturing cost can be reduced by forming at least some of the p-type organic semiconductor films 122, 132, 142, etc. of these transistors in the same step using the same material as the p-type organic semiconductor film 112, etc. of the phototransistor 110.

An example of the image sensor including the photoelectric conversion elements arranged in a matrix array has been described in the above-described embodiments. However, the image sensor is not limited thereto, and a line sensor including the photoelectric conversion elements arranged in a straight line may be provided.

The above-described embodiments have described an example in which the light L incident through the open region 161 and reflected on the source document D brought into close contact with the glass substrate 101 enters the phototransistor 110. However, the present disclosure is not limited thereto. An example in which light from an object at a distance enters the phototransistor 110 in the absence of the open region 161 may also be provided.

INDUSTRIAL APPLICABILITY

As described above, the present disclosure is useful for an image sensor using an organic semiconductor material, etc.

DESCRIPTION OF REFERENCE CHARACTERS

101 Glass substrate
110 Phototransistor
111 Metal interconnection
112, 114, 122, 132, 142 P-type organic semiconductor film
113 N-type organic semiconductor film
120 Reset transistor
123 Source electrode
124 Drain electrode
130 Amplifier transistor
131 Gate electrode
133 Source electrode
134 Drain electrode
140 Row selection transistor
143 Source electrode
151 Power supply line
152 Ground line
153 Reset line
154 Selection line
155 Column output line
161 Open region
170 Amplifier/operation control circuit
201 Transparent conductive film
202 Insulating film
203 Metal interconnection
301 Vertical shift register
302 Noise canceller circuit
303 Horizontal shift register
304 Row selection transistor
305 Output line

The invention claimed is:
1. A light-receiving device, comprising:
a photoelectric conversion element; and an active element, wherein
the active element includes at least one of a reset element configured to reset the photoelectric conversion element, an amplifier element configured to amplify a detection signal based on the photoelectric conversion element, or a selection element configured to selectively output the detection signal based on the photoelectric conversion element, and the photoelectric conversion element and at least part of the active element are formed by using an identical organic semiconductor material or an identical high molecular functional material; wherein the photoelectric conversion element is a phototransistor constituted of a pnp-type or npn-type layered organic semiconductor bipolar transistor.

2. The light-receiving device of claim 1, wherein
the photoelectric conversion element and the active element are formed by using at least one of an identical electrode material or an identical insulating material.

3. The light-receiving device of claim 1, wherein
a base layer of the phototransistor has a thickness of 10 nm or larger and 40 nm or smaller.

4. The light-receiving device of claim 1, wherein
the photoelectric conversion element and the active element are formed on a glass substrate.

5. The light-receiving device of claim 1, wherein
the photoelectric conversion element and the active element are formed on a film substrate.

* * * * *